United States Patent [19]
Menichelli

[11] Patent Number: 5,994,949
[45] Date of Patent: Nov. 30, 1999

[54] NEGATIVE VOLTAGE CHARGE PUMP PARTICULARLY FOR FLASH EEPROM MEMORIES

[75] Inventor: Stefano Menichelli, Avezzano, Italy

[73] Assignees: Texas Instruments Incorporated, Dallas, Tex.; Consorzio Eagle, Avezzano, Italy

[21] Appl. No.: 08/994,470

[22] Filed: Dec. 19, 1997

[30] Foreign Application Priority Data

Dec. 23, 1996 [IT] Italy ................................ RM96A0899

[51] Int. Cl.⁶ ....................................................... G05F 1/10
[52] U.S. Cl. ............................ 327/536; 327/537; 363/60
[58] Field of Search .................................. 327/536, 537, 327/535, 538, 540, 543; 363/59, 60

[56] References Cited

U.S. PATENT DOCUMENTS

| 5,301,097 | 4/1994 | McDaniel | 363/60 |
| 5,748,032 | 5/1998 | Baek | 327/536 |
| 5,754,476 | 5/1998 | Caser et al. | 327/536 |
| 5,856,918 | 1/1999 | Soneda et al. | 363/60 |

*Primary Examiner*—Timothy P. Callahan
*Assistant Examiner*—Jung Ho Kim
*Attorney, Agent, or Firm*—William B. Kempler; Richard L. Donaldson

[57] ABSTRACT

A voltage multiplier has two mirrored sections which are clocked by nonoverlapping phases. Each section of the voltage multiplier has N stages: each stage is made of a capacitor and MOS transistors operating as switches. During a charging phase, the N capacitors are insulated from each other and the terminals of each capacitor are connected one to voltage Vpp and the other to ground GND by means of PMOS transistors. During the discharge phase, the N capacitors are connected in series, with the bottom plate of the first stage capacitor coupled to ground voltage GND and the top plate of the last-but-one stage capacitor coupled to the output through a PMOS transistor. The gate voltage of this PMOS transistor is furnished by the last stage, in the upper portion of the circuit, in order to drive the transistor into a fully on condition.

16 Claims, 3 Drawing Sheets

NEGATIVE VOLTAGE CHARGE PUMP PARTICULARLY FOR FLASH EEPROM MEMORIES

SPECIFICATION

This invention broadly relates to semiconductor memories and more particularly concerns a novel implementation of a voltage multiplier circuit that enables integrated circuits manufactured in CMOS technology to be operated under a standard supply voltage of 3.3 volts or 5.0 volts also in those cases in which higher voltages are required, generated within the circuit itself and in certain operation circumstances.

It is known, for instance, that, in EEPROM memories, besides the standard supply voltages of 5.0 or 3.3 volts, also higher voltages are utilized, for instance 12 volts or in other operation circumstances also 18 volts, in order to carry out programming operations of the memory cells or erasure operations. It is generally known that these memory devices require an additional supply arrangement, which entails some problems, due to the fact that obviously the need that two supply arrangements be provided rather than just one clearly cannot be considered as an advantage. The problem exists that a voltage higher than the supply voltage is to be provided on the same chip.

On-chip voltage multipliers, often referred to as "charge pumps", are typically utilized in order to enable integrated circuits to be operated from the standard power supply, although, as it occurs in Flash EEPROM memories, in certain operation modes, negative voltages and/or positive voltages higher than the standard power supply voltages are internally required.

As it is known to those skilled in the art, one of the issues to be always carefully kept into account in designing and implementing an integrated circuit is the utilization grade of the area of the silicon chip on which the integrated circuit is realized. From this view point, therefore, it should be kept into account that the silicon area needed to implement a charge pump circuit can noticeably vary depending on three primary factors: the supply voltage, the output requirements and the capacitance per unit area of the on-chip capacitors that are realized.

As a citation of the prior art, reference can be made to FIG. 1 which illustrates a schematically depicted conventional charge pump circuit, for negative voltages. As it can be observed, it substantially includes a diode chain $D_1$, $D_2$, ... $D_{N-1}$, $D_N$ plus an output diode $D_{OUT}$ inserted between the ground GND and the output $V_{out}$. The alternated nodes between the diodes of the chain are coupled to two clock signals PH and PH__ through capacitors $C_1$, $C_3$ ... $C_{N-1}$ and $C_2$, $C_4$, ... $C_N$, respectively.

In this circuit, the charge packets are "pumped" along the chain diodes according to the charging and discharging steps of the coupling diodes under the alternated actions of the above mentioned two clock signals PH and PH__, which are of opposite phases, with amplitude Vpp.

The diodes of FIG. 1 are typically replaced by PMOS designed to operate as diodes, since diodes capable to withstand negative voltages are not available in the conventional CMOS technology.

The performances of the circuit of FIG. 1 are strictly correlated with the diode efficiency and with the power supply voltage. Due to the very poor capability of PMOS transistors to accomplish the required diode function, particularly when high voltage PMOS transistors are employed in view of their higher $V_T$ value and their lower $K_P$ value with respect to low voltage PMOS transistors, in standard CMOS technology, the charge pump of FIG. 1 exhibits, especially at low power supply voltages, a very poor performance, in terms of both a voltage multiplication efficiency and a current drive capability.

Furthermore, the output voltage tends to collapse when the output current increases above the maximum allowable value. Lastly, it should be noted that, in the concerned circuit, the capacitors have to stand subjected to high voltages across themselves and this is a drawback in terms of silicon area usage, as it will be subsequently described when the capability per unit area will be discussed with respect to the dielectric oxide layer thickness.

In view of this prior art, it is a broad object of this invention to realize a charge pump circuit, implemented in CMOS technology, adapted to generate on-chip very high negative voltages, without the drawbacks and the complexities of the prior art approaches.

A further object of this invention is to realize a charge pump circuit as above said, which is also very flexible, as well as easily modifiable in order to fulfill any different and specific application requirements.

Additional objects of this invention are to realize a charge pump circuit as above said having a very high efficiency in terms of power, a very high current drive capability, as well as an efficient silicon area utilization.

The above mentioned objects are obtained by means of a negative voltage multiplier circuit for integrated circuits, comprising two mirrored sections driven by control signals generated by a logic circuitry which receives, as input signals, an enable signal and a clock signal, wherein each mirrored section, in one embodiment, includes N stages and each stage comprises a capacitor having a lower terminal and an upper terminal, the lower terminal is connected to a first switch that, in closed condition, couples the lower terminal of the capacitor to the power supply voltage, said lower terminal of the capacitor being additionally connected to a second switch that, in closed condition, couples the lower terminal of the capacitor to ground voltage, as far as the first stage is concerned, or to the upper terminal of the capacitor of the previous stage, the upper terminal of the capacitor is connected to a third switch that, in closed condition, couples the upper terminal of the capacitor to ground, the upper terminal of the capacitor of the N-th stage is connected to a last switch that, in closed in condition, couples the upper terminal of the capacitor of the N-th stage to the output of the voltage multiplier; said control signals directly or indirectly drive said switches such that, when the voltage multiplier is enabled, at a rate determined by said clock signal, each mirrored section in alternated times is switched over from a charging phase to a discharging phase, so that while a mirrored section is in charging phase, the other one is in discharging phase and vice versa; when a mirrored section of the circuit is charging phase, the last switch and all second switches thereof are in open condition, while its first and its third switches are in closed condition, so that all capacitors of this circuit section are parallel connected between the supply voltage and ground and are charged up to a voltage corresponding to said supply voltage, with the upper plate at ground and the lover plate at the supply voltage; when a mirrored section of the circuit is in discharging phase, all its first and third switches are in open condition, while its last switch and all its second switches are in closed condition, so that all capacitors are serially connected with one another, the lower terminal of the capacitor of the first stage being connected to the ground voltage and the upper terminal of the capacitor of the N-th stage being connected to the output of the voltage multiplier; when the voltage multiplier is disabled, both mirrored sections of the circuit are in charging phase.

In the above set forth circuit, said two mirrored circuit sections are driven by a first and a second control signals, having opposite polarities; when the mirrored section is in charging phase, said first control signal is at the power supply voltage, while said second control signal is at ground voltage; when the mirrored section is in discharging phase, said first control signal is at ground voltage, while said second control signal is at the power supply voltage.

In the preferred embodiment, the first and the second switches of the first stage of each mirrored section are realized by means of a conventional CMOS inverter so that said first switch is realized by means of a P-channel MOS transistor, having the source region connected to ground, the drain region connected to the lower terminal of the first stage capacitor and the gate region connected to the line of said second control signal, said second switch is realized by a N-channel MOS transistor having the source region and the N-well in which the transistor is realized connected to the power supply voltage, the drain region connected to the lower terminal of the first stage capacitor and the gate region connected to the line of said second control signal.

Furthermore, all said first switches, except for the ones of the first stage of both mirrored sections, are realized by means of P-channel MOS transistors having their source region connected to the line of said first control signal, their drain region connected to the lower terminal of the capacitor and their gate region connected to the power supply voltage.

Again in the preferred embodiment, all said second switches, except for the ones of the first stage of both mirrored sections, are realized by means of insulated N-channel MOS (iso-NMOS) transistors having their source region and the P-well, in which the transistor is realized, connected to the upper terminal of the capacitor of the previous stage, their drain region connected to the lower terminal of the capacitor of their own stage, whose deep N well is connected to the power supply voltage and their gate region is certainly connected to the line of said second control signal, while, as far as the upper stages are concerned, it can be connected to ground voltage.

As it will be seen, all said third switches are realized by means of P-channel MOS transistors, having their source region connected to the upper terminal of the capacitor, their drain region connected to ground voltage and their gate region connected to the upper terminal of one of the capacitors of the other mirrored section of the circuit so as to enable a suitable negative voltage to be picked off from the discharging section for application to the gate region of said MOS transistors in order to turn them fully on when they emulate a closed switch.

In the above described multiplier circuit, each stage further includes a diode having its cathode connected to ground voltage and its anode connected to the upper terminal of the capacitor in order to guarantee pre-charging of the capacitors when the voltage multiplier is disabled, said switches being in open condition due to the fact that they are realized by means of P-channel MOS transistors having their gate regions at a not-negative voltage because, since the voltage multiplier is disabled, both mirrored sections are in charging phase.

As it will be observed, said diodes are realized by means of P-channel MOS transistors, having their source region connected to the upper terminal of the capacitor and their drain and gate regions both connected to ground voltage and whose N well region in which the transistor is realized is connected to the power supply voltage or, as far as the upper stages are concerned, it can be connected to the line of said first control signal.

In a different and preferred embodiment, said last switch is realized by means of a P-channel MOS transistor having its drain region connected to the output of the voltage multiplier circuit, its source region connected to the upper terminal of the capacitor of the N-th stage, the N well region in which the transistor is realized can be connected to the power supply voltage or, preferably, to the line of said first control signal and, lastly, for correctly driving said PMOS transistor, its gate region is connected to the upper terminal of a supplementary (N+1)th stage, completely similar to the previous N-th stage, added to the upper portion of each mirrored section.

Further details and advantages of this invention will be evident from the following specification by referring to the enclosed drawings wherein the preferred embodiment is shown by way of illustration and not by way of limitation.

Figure 2A:
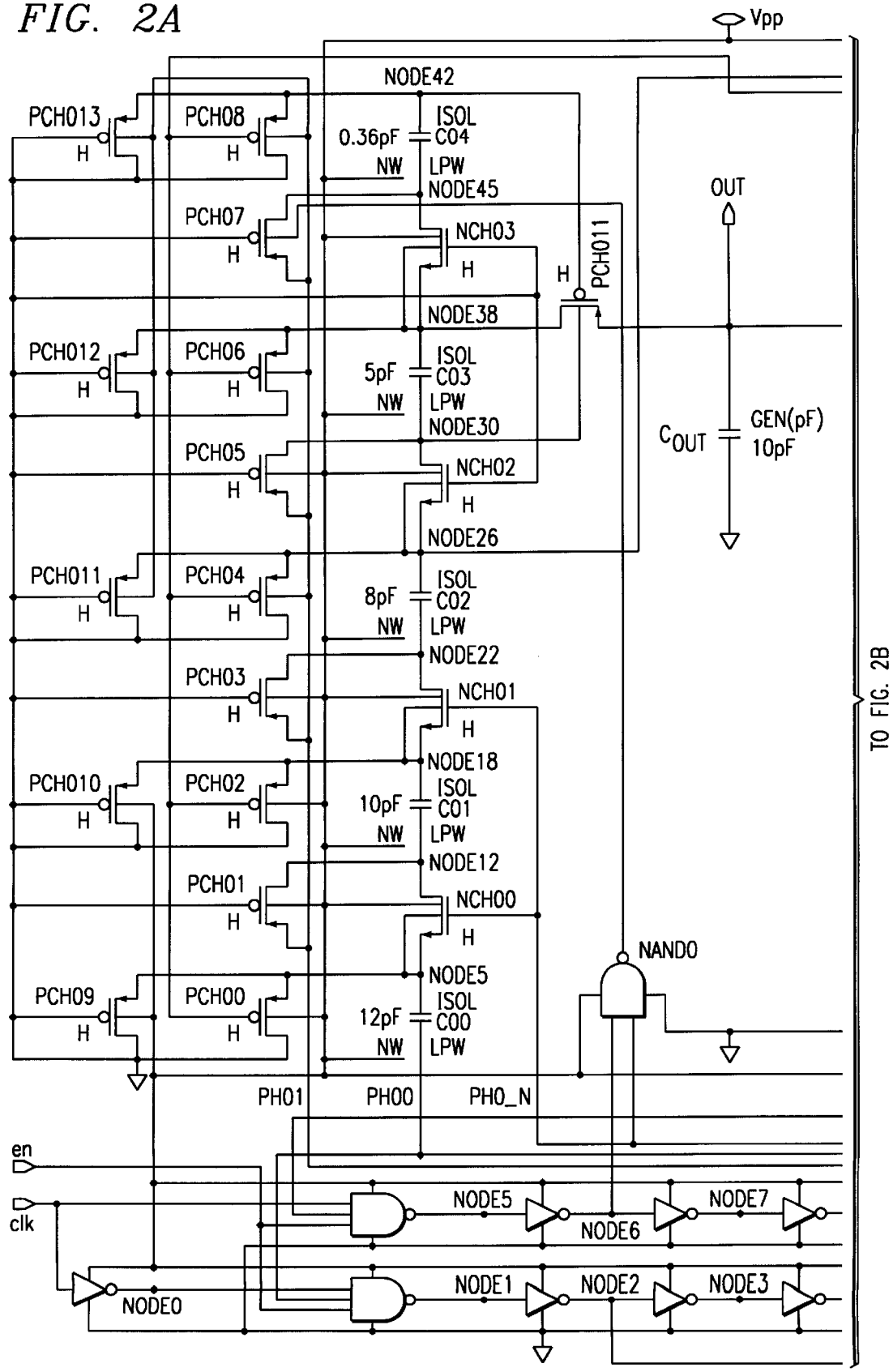
FIG. 2 shows a charge pump circuit of high voltage type according to this invention.
Figure 2B:
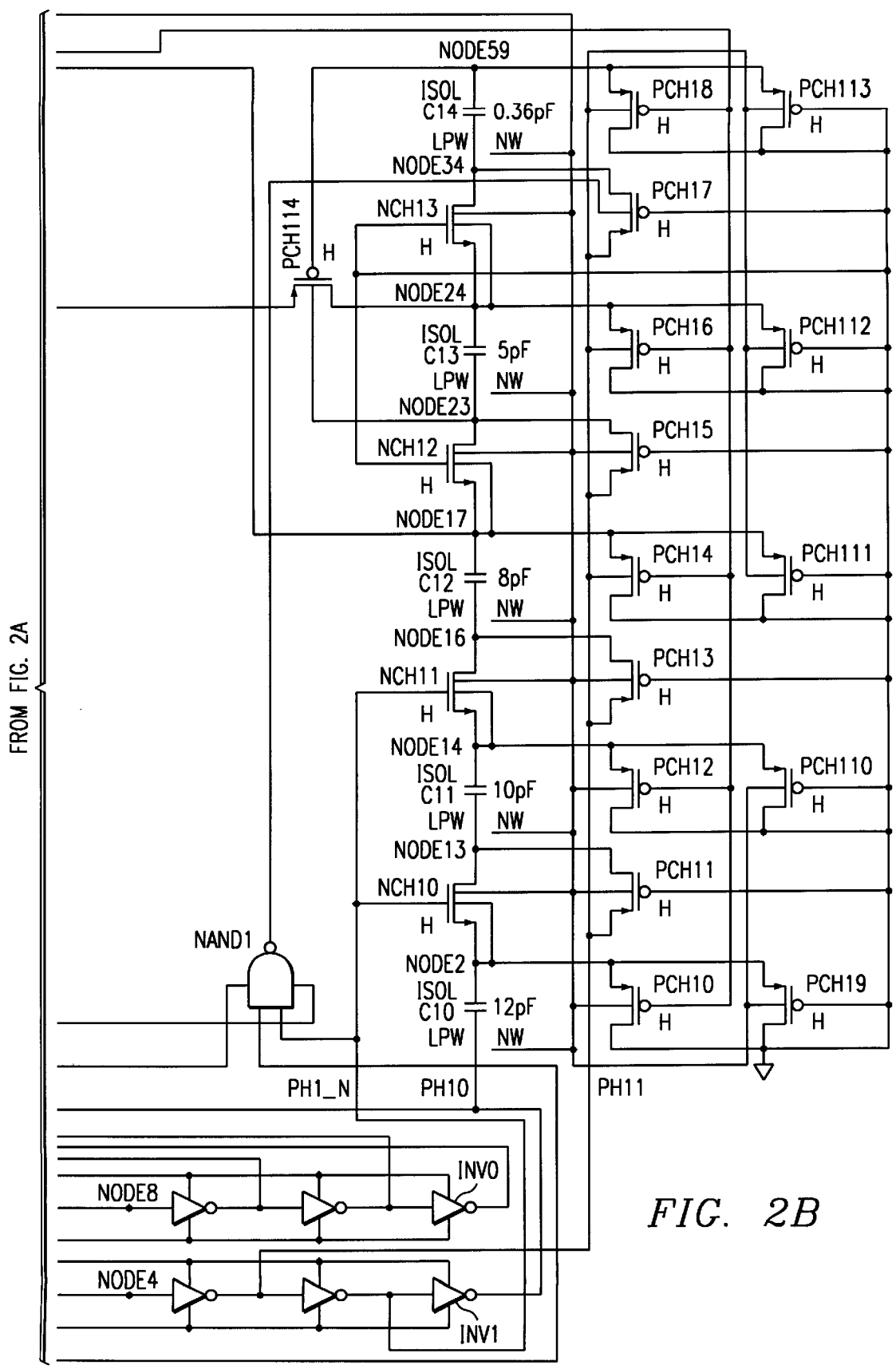

By referring now to FIG. 2, a novel voltage multiplier circuit is schematically shown, positively designed to furnish a very high voltage multiplication efficiency and a great current drive capability.

The basic voltage multiplier structure is made of two mirrored parts which are clocked by not overlapping phases. The full symmetry of the circuit allows limiting the analysis to just one half of it and to refer to the other half circuit only to the necessary extent to explain all steps of the operation. Each half section of the voltage multiplier comprises N stages: each stage is made of a capacitor and a few MOS transistors operating as switches. Said N capacitors are insulated from one another and charged in parallel to voltage Vpp during a phase of the clock signal, while, during the subsequent phase of the clock signal, said N capacitors are connected in series, to enable said capacitors, except for one of them, to be directly discharged to the output. According to the clock signal, said N capacitors are insulated from each other and are connected together by means of insulated NMOS (iso-NMOS) transistors.

As it is known, an insulated NMOS transistor is typically implemented by using a deep N-well that contains a P-well in which the NMOS transistor is realized. Insulated NMOS transistors are mainly built to handle negative voltages. The bulk of this type is insulated from the P— substrate by means of the deep N well and can be driven to different voltages, other than ground, provided that all pn junctions be never forwardly biased. For negative voltages or positive voltages not higher than the power supply voltage, the deep N well can be tied to the power supply voltage Vpp, whereas the P well region can be short circuited to the source region which has always to be at a voltage not higher than the drain voltage.

During the charging phase, said N capacitors are insulated from each other and the two terminals of each capacitor are connected one to voltage Vpp and the other one to ground GND by means of PMOS transistors. During the discharge phase, said N capacitors are connected in series, with the bottom plate of the first stage capacitor coupled to ground voltage GND and the top plate of the last-but-one stage capacitor coupled to the output through a PMOS transistor. The gate voltage of this PMOS transistor is furnished by the last stage, in the upper portion of the circuit, in order to drive the transistor into a fully on condition.

The charge pump circuit of FIG. 2 is particularly adapted for use in an embedded Flash EEPROM and it has been illustrated for the case N=5 and for providing an output voltage of −9 Volts. In addition, it should be noted that only high voltage MOS transistors are employed in the circuit of FIG. 2, except for the logic gates that are realized by low voltage MOS transistors.

The control signals are generated by logic gates that are shown in the bottom part of FIG. 2 and effectively form a not-overlapping phase generator.

In wait or stand-by conditions, in which signal en is low, phases PH00, PH01, PH11 and PH10 are at Vpp voltage, whereas phases PHO_N and PH1_N are at ground voltage GND. Capacitors C00, C01, C02, C03, C04, C10, C11, C12, C13 and C14 are charged to Vpp-Vd, where Vd is the voltage drop across the related PMOS transistor connected as a diode. In effect, considering any one of the capacitors, for instance C01, in stand-by mode, node 18 is held at Vd by transistor NCH010 and node 12 is connected to the power supply voltage Vpp by transistor PCH01 which is on because it has the gate region coupled to ground GND and because its source region is connected to phase PH01 that is at voltage Vpp.

This means that, in stand-by mode, each capacitor C00, C01, C02, C03, C04 and C10, C11, C12, C13, C14 is pre-charged to Vpp-Vd.

In operating mode, enable signal en is high and clock signal clk is in free running condition. When it is assumed, as a starting point of the analysis, that the clock signal clk is low, then phases PH00, PH01 and PH1_N are at voltage Vpp, while phases PHO_N, PH11 and PH10 are at ground GND. In this case, the left side of the voltage multiplier circuit is in charging phase, while its right side is in discharging phase. In the left side of the voltage multiplier circuit, which is in charging phase, transistors NCH00, NCH01,NCH02 and NCH03 are off because their gate regions are at ground voltage GND and their source—drain voltages are not-negative. Therefore, capacitors C01, C02, C03 and C04 are insulated from each other. Since phases PH00 and PH01 are at voltage Vpp and node 17 is at a proper negative voltage, as it will be evident hereinbelow, transistors PCH00, PCH01, PCH02, PCH03, PCH04, PCH05, PCH06, PCH07 and PCH08 are conductive or on, thereby fully charging capacitors C00, C01, C02, C03 and C04 to voltage Vpp.

Transistor PCH014, that connects the upper plate of the last-but-one capacitor to the output, is off because its gate region connected to node 42 and its drain region connected to node 38 are both at ground voltage GND.

In the right side of the voltage multiplier circuit, which is in discharging phase, since phase PH1_N is at voltage Vpp and the voltages on node 17, on node 23, on node 24 and on node 34 are negative, transistors NCH10, NCH11, NCH12 and NCH13 are on, consequently connecting capacitors C10, C11, C12, C13 and C14 in series. As phases PH10 and PH11 are at ground GND and node 26 is at a voltage not lower than the ground voltage GND, since the left side of the circuit is in charging phase, then transistors PCH10, PCH11, PCH12, PCH13, PCH14, PCH15, PCH16, PCH17 and PCH18 are off. The serially connected capacitors C10, C11, C12 and C13 can be discharged to the output through transistor PCH14 which is in a fully on condition, since its gate voltage is properly furnished by the last stage of the upper right portion of the circuit (capacitor C14).

When the clock signal clk switches from low to high, in the first place all the phase voltages PH11 and PH10 are switched to Vpp, while the phase voltage PH1_N becomes GND. Transistors PCH11, PCH13, PCH15 and PCH17 are turned on thereby making the voltages on the right side of the voltage multiplier circuit to rise. In turn, transistors NCH10, NCH11, NCH12 and NCH13 are switched off. The voltage on node 17 takes a not-negative value and transistors PCH00, PCH02, PCH04, PCH06 and PCH08 are switched off.

After the voltage of phase PH11 has gone to Vpp, the voltage of phase PH01 becomes GND, thereby discharging node 12, node 22, node 30 and node 45 through transistors PCH01, PCH03, PCH05 and PCH07 acting as diodes until they are turned off. This discharge improves the circuit performance, since parasitic capacitors are coupled to these nodes.

It is known, in fact, that, in MOS technology, a capacitor whose terminals can be driven to negative voltages is typically realized by using a layer of polysilicon, as first terminal, on an underlying thin or thick layer of gate oxide of MOS transistors, as dielectric, which is laid on a P-type diffusion region (P-well), as a second plate, which is contained in a deep N-well in order to insulate the P well from the P— substrate. A P+ diffusion, in the P diffusion or P well region, surrounds the polysilicon/oxide/P well vertical structure, thereby decreasing the series resistance and allowing the contacts to the P well of the second capacitor terminal to be effected. The pn junction which forms between the P well and the deep N well is a parasitic capacitance, associated with the capacitor, whose value is a function of the P well voltage, since the deep N well is typically connected to a fixed voltage, such as Vpp. This parasitic capacitance decreases as the voltage across the reverse biased pn junction increases. Thus, the very fast discharging of node 12, of node 22, of node 30, of node 45, of node 13, of node 16, of node 23 as well as of node 34, before the discharge phase is started, prevents a loss of the "useful" charge of the capacitors which would be used to charge the parasitic capacitors in the first voltage range in which they have their maximum capacitance value. Lastly, all capacitors built with a thin gate oxide of the MOS transistor, rather than with a thick gate oxide, have a much lower parasitic capacitance, since the value of the parasitic capacitance is proportional to the pn junction surface area.

It can be observed now, with continuous reference to the analysis of the circuit, that the PHO_N phase voltage subsequently takes the value Vpp, thereby turning transistors NCH00 and NCH01 on, the PH00 phase voltage takes the GND value and transistors NCH02 and NCH03 are turned on, in view of the negative voltages applied to their source regions. In particular, the voltage on node 26 lowers to negative value given by $V_{out}$ plus the voltage across capacitor C03 minus the source-drain voltages of transistors PCH014 and NCH02. The negative voltage on node 26 switches transistors PCH10, PCH12, PCH14, PCH16 and PCH18 to a fully conductive state. At this time, the transitions in the circuit due to the clock signal clk are completed.

The left side of the voltage multiplier circuit is now in discharging phase, while its right side is in charging phase.

As the circuit of FIG. 2 is fully symmetrical, a perfectly analogous description of the circuit behaviour could be repeated to analyze the operation when the clock signal clk goes from high to low.

All the high voltage MOS transistors of the circuit of FIG. 2 always switch in very safe conditions so as to prevent any risk of field plate breakdown, which is a typical breakdown risk occurring in transistors switching with high voltages across them. In view of this, several connections have been rearranged to reduce the voltage across the more stressed transistors. The gate regions of transistors NCH02 and NCH03, as well as the gate regions of transistors NCH12 and NCH13 are coupled to ground GND, in stead of being coupled to the PH0_N and PH1_N phase voltages. Furthermore, the N tank diffusions of transistors PCH04, PCH06, PCH08, PCH011, PCH012, PCH013 and PCH014, as well as the N tank diffusions of transistors PCH14, PCH16, PCH18, PCH111, PCH112, PCH113 and PCH114 are not connected to voltage Vpp, but are properly driven by the PH01 and PH11 phase voltages, respectively.

Lastly, the logic gates NAND0 and NAND1 provide the right timing to switch the voltage of the N tanks of transistors PCH07 and PCH17.

Figure 1:
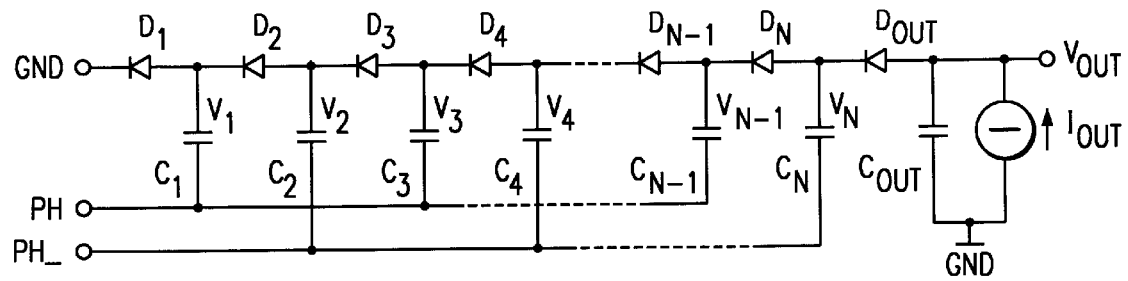
FIG. 1 shows a charge pump circuit according to conventional technology.

Unlike the circuit of FIG. 1, in the novel voltage multiplier scheme according to this invention, the maximum voltage across each capacitor is only equal to the power supply voltage Vpp. This observation is very important from an efficient silicon area usage view point when, as it occurs in many cases, the capacitor dielectric is made by the MOS transistor gate oxide. In fact, the maximum allowed voltage across the gate oxide of a MOS transistor depends on the thickness of the gate oxide itself. Low voltage MOS transistors are made with a thin gate oxide which has a very high capacitance per unit area. In contrast, high voltage MOS transistors are made with thick gate oxide, because they have to withstand high voltages; however, a thick gate oxide, compared to a thin gate oxide, has a much lower capacitance per unit area.

The voltage multiplier according to the scheme of this invention allows a very thin gate oxide to be used for realizing the capacitors and this is a really noticeable advantage in terms of silicon area usage. In some effective embodiments of this invention (Epic3-Flash merged technology (33M12)), the thin gate oxide of the MOS transistor has a thickness of 8 nm and a capacitance per unit area of about 3.8 FF/$\mu$m$^2$, the thick gate oxide of the MOS transistor has a thickness of 21 nm and a capacitance per unit area of 1.6 FF/$\mu$m$^2$. The silicon area needed to build the same capacitor is more than twice larger if a thick MOS gate oxide is used instead of a thin MOS gate oxide.

Figure 3:
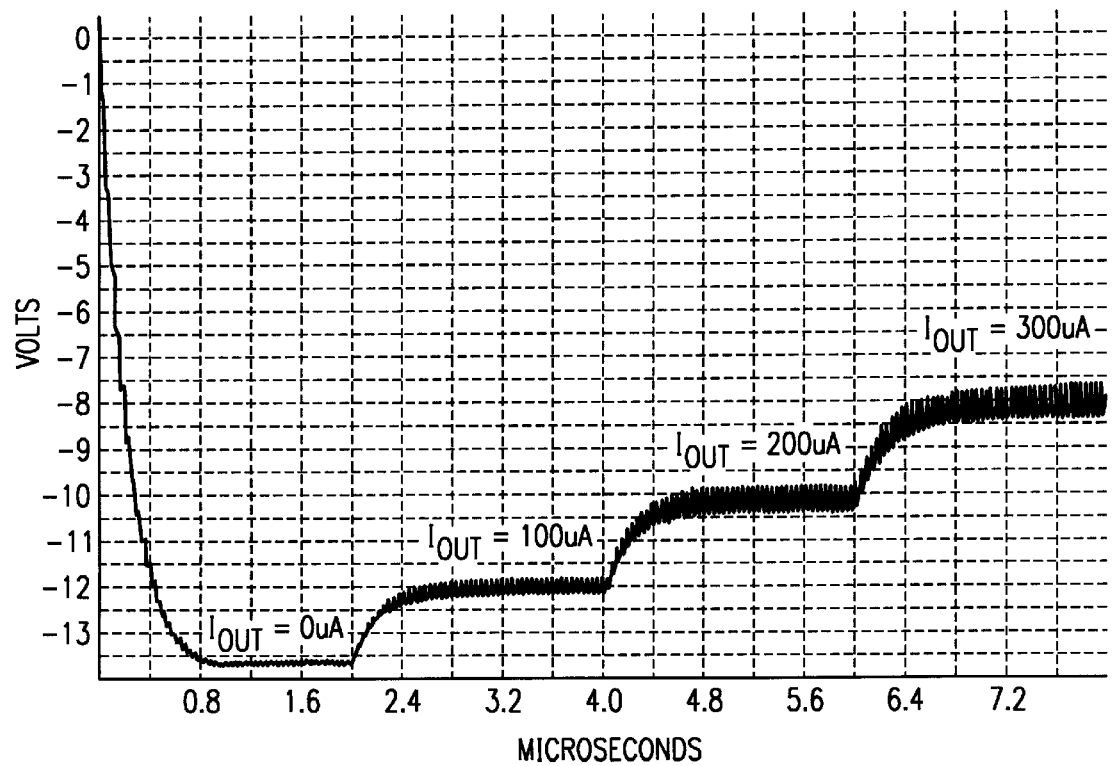
FIG. 3 shows the output voltage $V_{OUT}$ behaviour in the charge pump circuit of FIG. 2.

The charge pump circuit of FIG. 2 has been simulated by utilizing SPICE models, a clock period of 80 ns and a power supply voltage of 4 volts, furnished by a high current voltage regulator which is integrated with the embedded Flash EEPROM memory. The parasitic capacitance has been taken into account in the SPICE simulation by connecting an additional capacitor between the bottom plate of each capacitor and the power supply voltage Vpp. Each parasitic capacitance has been estimated at 1.2% of the capacitor value which it is associated with. Furthermore, an ideal current source $I_{OUT}$ has been inserted between the output and ground in order to emulate the load current. The waveform of the output voltage $V_{OUT}$ is shown in FIG. 3. It shows that the negative voltage charge pump of FIG. 2 is equivalent to an ideal voltage generator of −13.7 V serially connected to a resistor of 18 kohms. A voltage multiplier based upon this scheme is equivalent to an ideal voltage generator Vo with a serially connected resistor Ro the values of which, in the range of interest and with good approximation, are proportional to Vpp and to the clock period T, respectively, that is to say Vo≃$\alpha$* Vpp and Ro≃$\beta$* T. The $\alpha$ and $\beta$ coefficients depend on the circuit only. As it has been shown by the SPICE simulation, for an output current in the range 200 $\mu$A to 300 $\mu$A, the power efficiency is practically constant and equal to 33%, which is a very high value for a charge pump circuit for negative voltage.

The preferred embodiment has been described and some modifications have been suggested above, but it should be understood that those skilled in the art can make modifications and changes to the components without departing from the scope of this invention as defined in the attached claims.

I claim:

1. A negative voltage multiplier circuit for integrated circuits, comprising two mirrored sections driven by control signals (PH00, PH01, PH0_N; PH10, PH11, PH1_N) generated by a logic circuitry which receives, as input signals, an enable signal (en) and a clock signal (clk), wherein each mirrored section includes N stages and each stage comprises a capacitor (C00, C01, C02, C03; C10, C11, C12, C13) having a lower terminal and an upper terminal, the lower terminal is connected to a first switch (INV0, PCH01, PCH03, PCH05; INV1, PCH11, PCH13, PCH15) that, in closed condition, couples the lower terminal of the capacitor to a power supply voltage (Vpp), said lower terminal of the capacitor being additionally connected to a second switch (INV0, NCH00, NCH01, NCH02; INV1, NCH10, NCH11, NCH12) that, in closed condition, couples the lower terminal of the capacitor to ground voltage (GND), as far as a first stage is concerned, or to the upper terminal of the capacitor of the previous stage; the upper terminal of the capacitor is connected to a third switch (PCH00, PCH02, PCH04, PCH06; PCH10, PCH12, PCH14, PCH16) that, in closed condition, couples the upper terminal of the capacitor to ground (GND), the upper terminal of the capacitor (C03; C13) of the N-th stage is connected to a last switch (PCH014; PCH114) that, in closed in condition, couples the upper terminal of the capacitor of the N-th stage to an output of the voltage multiplier; said control signals directly or indirectly drive said switches such that, when the voltage multiplier is enabled (en=1), at a rate determined by said clock signal (clk), each mirrored section in alternated times is switched over from a charging phase to a discharging phase, so that while a mirrored section is in charging phase, the other one is in discharging phase and vice versa; when a mirrored section of the circuit is charging phase, the last switch (PCH014; PCH114) and all second switches thereof (INV0, NCH00, NCH01, NCH02; INV1, NCH10, NCH11, NCH12) are in open condition, while its first (INV0, PCH01, PCH03, PCH05; INV1, PCH11, PCH13, PCH15) and its third switches (PCH00, PCH02, PCH04, PCH06; PCH10, PCH12, PCH14, PCH16) are in closed condition, so that all capacitors of this circuit section are parallel connected between the supply voltage (Vpp) and ground (GND) and are charged up to a voltage corresponding to said supply voltage (Vpp), with the upper plate at ground and the lower plate at the supply voltage (Vpp); when a mirrored section of the circuit is in discharging phase, all its first (INV0, PCH01, PCH03, PCH05; INV1, PCH11, PCH13, PCH15) and third switches (PCH00, PCH02, PCH04, PCH06; PCH10, PCH12, PCH14, PCH16) are in open condition, while its last switch (PCH014; PCH114) and all its second switches (INV0, NCH00, NCH01, NCH02; INV1, NCH10, NCH11, NCH12) are in closed condition, so that all capacitors are serially connected with one another, the lower terminal of the capacitor (C00; C10) of the first stage being connected to the ground voltage (GND) and the upper terminal of the capacitor of the N-th stage being connected to the output of the voltage multiplier; when the voltage multiplier is disabled (en=0), both mirrored sections of the circuit are in charging phase.

2. A voltage multiplier circuit for integrated circuits according to claim 1, wherein said two mirrored circuit sections are driven by a first and a second control signals (PH01 and PHO_N; PH11 and PH1_N) respectively, having opposite polarities; when the mirrored section is in charging phase, said first control signal is at the power supply voltage (Vpp), while said second control signal is at ground voltage (GND); when the mirrored section is in discharging phase, said first control signal is at ground voltage (GND), while said second control signal is at the power supply voltage (Vpp).

3. A voltage multiplier circuit for integrated circuits according to claim 1 wherein the first and the second switch of the first stage of each mirrored section are realized by means of a conventional CMOS inverter (INVO, INVI) so that said first switch is realized by means of a P-channel MOS transistor, having the source region connected to ground, the drain region connected to the lower terminal of the first stage capacitor (C00, C10) and the gate region connected to the line of said second control signal (PHO_N, PH1_N), said second switch is realized by a N-channel MOS transistor having the source region and the N-well in which the transistor is realized connected to the power supply voltage (Vpp), the drain region connected to the lower terminal of the first stage capacitor (C00, C10) and the gate region connected to the line of said second control signal (PHO_N, PH1_N).

4. A voltage multiplier circuit for integrated circuits according to claim 1 wherein all said first switches, except for the ones of the first stage of both mirrored sections, are realized by means of P-channel MOS transistors (PCH01, PCH03, PCH05; PCH11, PCH13, PCH15) having their source region connected to the line of said first control signal (PH01, PH11), their drain region connected to the lower terminal of the capacitor and their gate region connected to ground voltage (GND).

5. A voltage multiplier circuit for integrated circuits according to claim 1 wherein said second switches (NCH00, NCH01, NCH02; NCH10, NCH11, NCH12), except for the ones of the first stage of both mirrored sections, are realized by means of N-channel MOS transistors of insulated type (iso-NMOS), having their source region and the P well diffusion region, in which the transistor is realized, connected to the upper terminal of the capacitor of the previous stage, their drain region connected to the lower terminal of the capacitor of their own stage, their deep N well region connected to the power supply voltage and their gate region connected, as far as some stages (NCH00, NCH01; NCH10, NCH11) are concerned, to the line of said second control signal (PH0_N, PH1_N), while, as far as some other stages (NCH02; NCH12) are concerned, it is connected to ground voltage (GND).

6. A voltage multiplier circuit for integrated circuits according to claim 1, wherein all said third switches (PCH00, PCH02, PCH04, PCH06; PCH10, PCH12, PCH14, PCH16) are realized by means of P-channel MOS transistors, having their source region connected to the upper terminal of the capacitor, their drain region connected to ground voltage (GND) and their gate region connected to the upper terminal of one of the capacitors (C12. C02) of the other mirrored section of the circuit so as to enable a suitable negative voltage to be picked off from the discharging section for application to the gate regions of said MOS transistors in order to turn them fully on when they emulate a closed switch.

7. A voltage multiplier circuit for integrated circuits according to claim 1 wherein each stage further includes a diode (PCH09, PCH10, PCH11, PCH12; PCH19, PCH110, PCH111, PCH112) having its cathode connected to ground voltage (GND) and its anode connected to the upper terminal of the capacitor in order to guarantee pre-charging of the capacitors when the voltage multiplier is disabled (en=0), said switches being in open condition due to the fact that they are realized by means of P-channel MOS transistors having their gate regions at a not negative voltage because, since the voltage multiplier is disabled, both mirrored sections are in charging phase.

8. A voltage multiplier circuit for integrated circuits according to claim 7, wherein said diodes (PCH09, PCH010, PCH011, PCH012; PCH19, PCH110, PCH111, PCH112) are realized by means of P-channel MOS transistors, having their source region connected to the upper terminal of the capacitor and their drain and gate regions both connected to ground voltage (GND) and the N well diffusion region, in which the transistor is realized, connected to the power supply voltage (Vpp) or, as far as some stages are concerned, is connected to the line of said second control signal.

9. A voltage multiplier circuit for integrated circuits according to claim 1, wherein said last switch (PCH014; PCH114) is realized by means of a P-channel MOS transistor having its drain region connected to the output of the voltage multiplier circuit; its source region connected to the upper terminal of the capacitor (C03; C13) of the N-th stage, an N well diffusion region, in which the transistor is realized, is connected to the power supply voltage (Vpp) or, preferably, to the line of said first control signal (PH01; PH11) and, lastly, for correctly driving said PMOS transistor, its gate region is connected to an upper terminal of a capacitor of a supplementary (N+1)th stage (C04, PCH07, NCH03, PCH08, PCH013; C14, PCH17, NCH13, PCH18, PCH113), completely similar to the previous N-th stage, added to the upper portion of each mirrored section.

10. A voltage multiplier circuit for integrated circuits according to claim 2, wherein the first and the second switch of the first stage of each mirrored section are realized by means of a conventional CMOS inverter (INVO, INVI) so that said first switch is realized by means of a P-channel MOS transistor, having the source region connected to ground, the drain region connected to the lower terminal of the first stage capacitor (C00, C10) and the gate region connected to the line of said second control signal (PHO_N, PH1_N), said second switch is realized by a N-channel MOS transistor having the source region and an N-well in which the transistor is realized connected to the power supply voltage (Vpp), the drain region connected to the lower terminal of the first stage capacitor (C00, C10) and the gate region connected to the line of said second control signal (PHO_N, PH1_N).

11. A voltage multiplier circuit for integrated circuits according to claim 2, wherein all said first switches, except for the ones of the first stage of both mirrored sections, are realized by means of P-channel MOS transistors (PCH01, PCH03, PCH05; PCH11, PCH13, PCH15) having their source region connected to the line of said first control signal (PH01, PH11), their drain region connected to the lower terminal of the capacitor and their gate region connected to ground voltage (GND).

12. A voltage multiplier circuit for integrated circuits according to claim 2, wherein all said second switches (NCH00, NCH01, NCH02; NCH10, NCH11, NCH12), except for the ones of the first stage of both mirrored sections, are realized by means of N-channel MOS transistors of insulated type (iso-NMOS), having their source region and a P well diffusion region, in which the transistor is realized, connected to the upper terminal of the capacitor of the previous stage, their drain region connected to the lower terminal of the capacitor of their own stage, their deep N well region connected to the power supply voltage and their gate region connected, as far as some stages (NCH00, NCH01; NCH10, NCH11) are concerned, to the line of said second control signal (PH0_N, PH1_N), while, as far as some other stages (NCH02; NCH12) are concerned, it is connected to ground voltage (GND).

13. A voltage multiplier circuit for integrated circuits according to claim 6, wherein each stage further includes a diode (PCH09, PCH10, PCH11, PCH12; PCH19, PCH110, PCH111, PCH112) having its cathode connected to ground voltage (GND) and its anode connected to the upper terminal of the capacitor in order to guarantee pre-charging of the capacitors when the voltage multiplier is disabled (en=0), said switches being in open condition due to the fact that they are realized by means of P-channel MOS transistors having their gate regions at a not negative voltage because, since the voltage multiplier is disabled, both mirrored sections are in charging phase.

14. A voltage multiplier circuit for integrated circuits according to claim 13, wherein said diodes (PCH09, PCH010, PCH011, PCH012; PCH19, PCH110, PCH111, PCH112) are realized by means of P-channel MOS transistors, having their source region connected to the upper terminal of the capacitor and their drain and gate regions both connected to ground voltage (GND) and an N well diffusion region, in which the transistor is realized, connected to the power supply voltage (Vpp) or, as far as some stages are concerned, is connected to the line of said second control signal.

15. A voltage multiplier circuit for integrated circuits according to claim 6, wherein said diodes (PCH09, PCH010, PCH011, PCH012; PCH19, PCH110, PCH111, PCH112) are realized by means of P-channel MOS transistors, having their source region connected to the upper terminal of the capacitor and their drain and gate regions both connected to ground voltage (GND) and an N well diffusion region, in which the transistor is realized, connected to the power supply voltage (Vpp) or, as far as some stages are concerned, is connected to the line of said second control signal.

16. A voltage multiplier circuit for integrated circuits according to claim 7, wherein said diodes (PCH09, PCH010, PCH011, PCH012; PCH19, PCH110, PCH111, PCH112) are realized by means of P-channel MOS transistors, having their source region connected to the upper terminal of the capacitor and their drain and gate regions both connected to ground voltage (GND) and an N well diffusion region, in which the transistor is realized, connected to the power supply voltage (Vpp) or, as far as some stages are concerned, is connected to the line of said second control signal.

* * * * *